(12) United States Patent
Goodwin

(10) Patent No.: US 9,534,934 B2
(45) Date of Patent: Jan. 3, 2017

(54) HIGH RESOLUTION ENCODER HEAD

(75) Inventor: Eric Peter Goodwin, Tucson, AZ (US)

(73) Assignee: NIKON CORPORATION (JP)

( * ) Notice: Subject to any disclaimer, the term of this patent is extended or adjusted under 35 U.S.C. 154(b) by 99 days.

(21) Appl. No.: 14/239,773

(22) PCT Filed: Sep. 5, 2012

(86) PCT No.: PCT/US2012/053727
§ 371 (c)(1),
(2), (4) Date: Feb. 19, 2014

(87) PCT Pub. No.: WO2013/036498
PCT Pub. Date: Mar. 14, 2013

(65) Prior Publication Data
US 2014/0183345 A1    Jul. 3, 2014

Related U.S. Application Data

(60) Provisional application No. 61/531,545, filed on Sep. 6, 2011.

(51) Int. Cl.
*G01D 5/34* (2006.01)
*G03F 7/20* (2006.01)
*H01L 21/67* (2006.01)

(52) U.S. Cl.
CPC ............ *G01D 5/34* (2013.01); *G03F 7/70775* (2013.01); *H01L 21/67259* (2013.01)

(58) Field of Classification Search
CPC .... G01D 5/35; G01D 5/3473; G01D 5/34746; G01D 5/26
(Continued)

(56) References Cited

U.S. PATENT DOCUMENTS 5,646,730 A    7/1997 Mitchell et al.
6,677,601 B2    1/2004 Shiraishi
(Continued)

FOREIGN PATENT DOCUMENTS

JP    2005-308592 A    11/2005

OTHER PUBLICATIONS

The International Preliminary Report on Patentability for PCT/US2012/053727, Mar. 20, 2014, Nikon Corporation (related to the present application).
(Continued)

*Primary Examiner* — Renee Chavez
(74) *Attorney, Agent, or Firm* — Roeder & Broder LLP; Steven G. Roeder

(57) ABSTRACT

A measurement system (22) for measuring the position of a work piece (28) along a first axis includes a grating (234), and an encoder head (238) that directs a first measurement beam (240) at the grating (234) at a first angle, and directs a second measurement beam (242) at the grating (234) at a second angle. An absolute value of the first angle relative to a normal (244) of the grating (234) is different from an absolute value of the second angle relative to the normal (244) of the grating (234). Additionally, the first measurement beam (240) has a first wavelength, and the second measurement beam (242) has a second wavelength that can be different from the first wavelength. Further, the first measurement beam (240) and the second measurement beam (242) can impinge at approximately the same location on the grating (234).

29 Claims, 7 Drawing Sheets

(58) Field of Classification Search
USPC .......... 250/231.1–231.18; 33/706, 707, 1 N, 33/1 PT; 341/13, 14; 356/616, 617
See application file for complete search history.

(56) References Cited

U.S. PATENT DOCUMENTS

| | | | |
|---|---|---|---|
| 7,333,214 B2 | 2/2008 | Sesko | |
| 7,902,494 B2 | 3/2011 | Klaver et al. | |
| 8,134,688 B2 | 3/2012 | Shibazaki | |
| 2005/0236558 A1 | 10/2005 | Nabeshima et al. | |
| 2008/0094593 A1* | 4/2008 | Shibazaki ........... | G03F 7/70725 355/53 |
| 2012/0032067 A1 | 2/2012 | Goodwin et al. | |
| 2012/0127453 A1 | 5/2012 | Shibazaki | |
| 2013/0048842 A1 | 2/2013 | Goodwin et al. | |

OTHER PUBLICATIONS

The International Search Report and Written Opinion for PCT/US2012/053727, Nov. 14, 2012, Nikon Corporation (related to the present application).

* cited by examiner

HIGH RESOLUTION ENCODER HEAD

RELATED APPLICATION

The application claims priority on U.S. Provisional Application Ser. No. 61/531,545 filed on Sep. 16, 2011, entitled "HIGH CONTRAST ENCODER HEAD". As far as is permitted, the contents of U.S. Provisional Application Ser. No. 61/531,545 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system. The measurement system constantly measures and/or monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

There is a constant desire to improve the accuracy of the measurement system.

SUMMARY

The present invention is directed to a measurement system for measuring the position or relative movement between a first object and a second object along a first axis. For example, one of the objects can be a workpiece. In some embodiments, the measurement system includes a grating that is coupled to the work piece, and an encoder head that directs a first measurement beam at the grating at a first angle, and directs a second measurement beam at the grating at a second angle. In one such embodiment, an absolute value of the first angle relative to a normal of the grating is different than an absolute value of the second angle relative to the normal of the grating. Further, in one embodiment, the first measurement beam has a first wavelength, and the second measurement beam has a second wavelength that is different than the first wavelength.

Additionally, in certain embodiments, the first measurement beam impinging on the grating creates a +1 order beam directed back at the encoder head, and the second measurement beam impinging on the grating creates a −1 order beam directed back at the encoder head. In some such embodiments, the encoder head includes (i) a first redirector that redirects the +1 order beam of the first measurement beam back at the grating, and (ii) a second redirector that redirects the −1 order beam of the second measurement beam back at the grating. For example, in one such embodiment, each redirector can be an imperfect corner cube.

In one embodiment, the first measurement beam, the second measurement beam, the +1 order beam of the first measurement beam, and the −1 order beam of the second measurement beam all impinge at approximately the same location on the grating. With the present invention, the measurement beams can be used to monitor the exact same location on the grating.

Additionally, in some embodiments, (i) a first reference beam can be combined with the −1 order beam of the second measurement beam that is diffracted off of the grating, and (ii) a second reference beam can be combined with the +1 order beam of the first measurement beam that is diffracted off of the grating. In one such embodiment, the first reference beam is at the first wavelength, and the second reference beam is at the second wavelength.

Moreover, in one embodiment, the first axis is normal to the work piece, and the light diffracted from the grating is utilized to determine the position of the work piece along the first axis.

Still further, in one embodiment, the first measurement beam can have a first polarization, and the second measurement beam can have a second polarization that is the same as the first polarization.

The present invention is also directed to a stage assembly that moves a work piece. The stage assembly includes a stage that retains the work piece, and the measurement system as described above that measures the position of the work piece. Additionally, the present invention is further directed to an exposure apparatus that includes an illumination system and a stage assembly as described above that moves the stage relative to the illumination system. Further, the present invention is directed to a process for manufacturing a device that includes the steps of providing a substrate and forming an image on the substrate with the exposure apparatus.

Still further, the present invention is also directed to a method for measuring the position of a work piece along a first axis, the method comprising the steps of: coupling a grating to the work piece; directing a first measurement beam at the grating at a first angle with an encoder head; and directing a second measurement beam at the grating at a second angle with the encoder head, wherein an absolute value of the first angle relative to a normal of the grating is different than an absolute value of the second angle relative to the normal of the grating.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
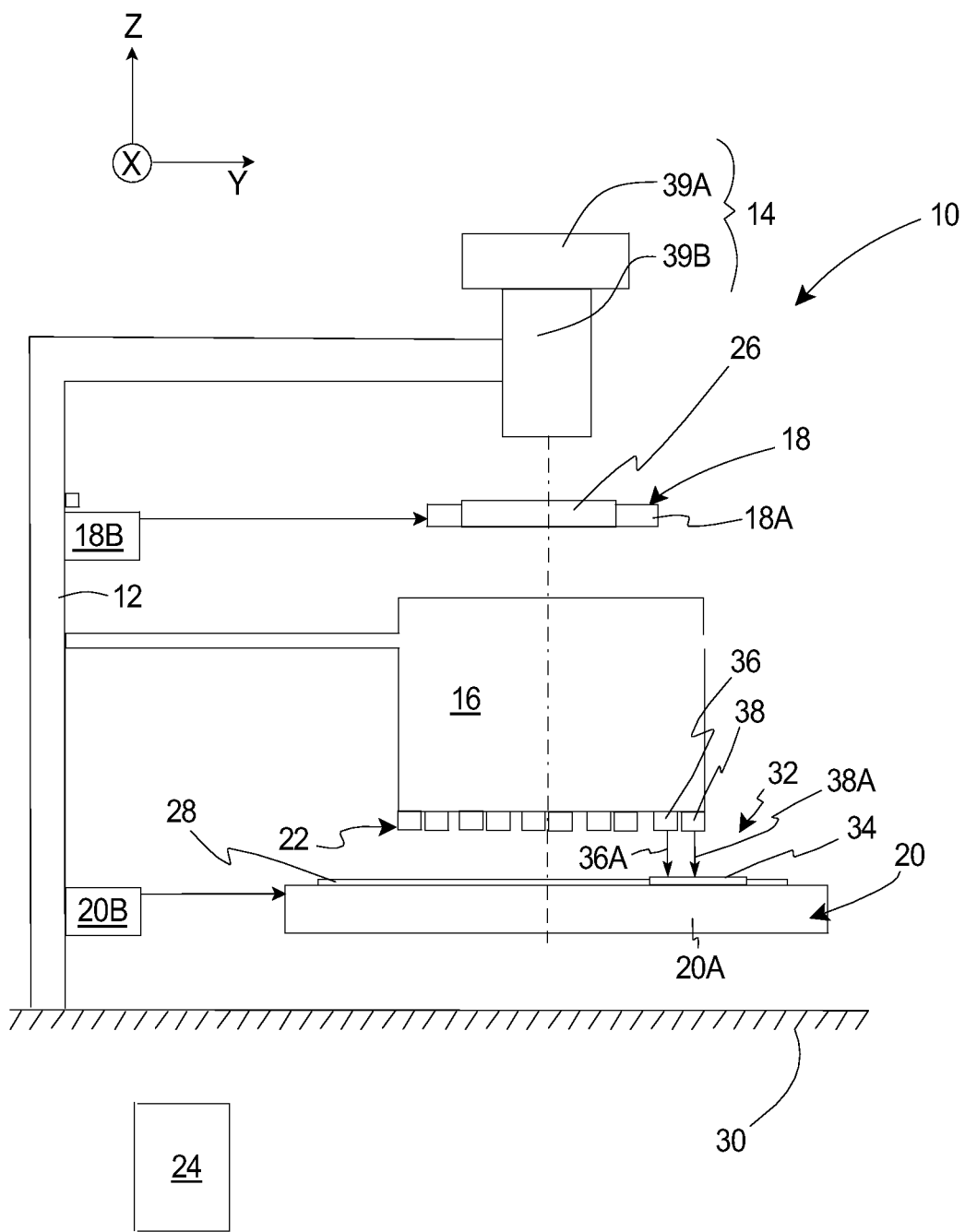
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, a floor or some other supporting structure.

As an overview, the measurement system 22 includes an encoder assembly 32 that measures the position and/or monitors the relative movement between a first object and a second object with improved accuracy. For example, the first object can be a work piece, e.g., the wafer 28, and the second object can be a reference. In some embodiments, the encoder assembly 32 can be designed to measure and/or monitor the movement of the work piece 28 along two axes (e.g., along the X and Z axes) relative to the reference. Additionally and/or alternatively, in one embodiment, the encoder assembly 32 can be designed to measure and/or monitor the movement of the work piece 28 along all three axes (i.e. along the X, Y and Z axes) relative to the reference.

In FIG. 1, the encoder assembly 32 includes (i) a grating 34 that is secured to a top of a stage, e.g., a wafer stage 20A, that retains the work piece 28, (ii) one or more fixed X encoder heads 36 that measure and/or monitor the position of the work piece 28 along the X axis, and (iii) one or more Z encoder heads 38 that measure and/or monitor the position of the work piece 28 along the Z axis. Additionally and/or alternatively, in embodiments where the encoder assembly 32 measures and/or monitors the position of the work piece 28 along all three axes, the encoder assembly 32 can further include one or more Y encoder heads (not shown) that measure and/or monitor the position of the work piece 28 along the Y axis. In FIG. 1, the Z axis is orthogonal to the work piece 28 (i.e. normal to the work piece 28). Further, (i) each X encoder head 36 directs one or more X measurement beams 36A (only one is illustrated in FIG. 1) towards the stage 20A, and (ii) each Z encoder head 38 directs one or more Z measurement beams 38A (only one is illustrated in FIG. 1) towards the stage 20A.

In this embodiment, each X encoder head 36 can be used to measure and/or monitor the position of the work piece 28 along the X axis when the grating 34 is positioned below it, and each Z encoder head 38 can be used to measure and/or monitor the position of the work piece 28 along the Z axis (e.g., the height of the work piece 28) when the grating 34 is positioned below it. Thus, as the stage 20A and the grating 34 are moved relative to the encoder heads 36, 38, the encoder heads 36, 38 positioned above the grating 34 will be used to measure and/or monitor the position of the work piece 28 that is retained by the stage 20A.

The number of encoder heads 36, 38 can be varied according to the design of the system and the amount of travel of the stage 20A. It should be noted that the five X encoder heads 36 and the five Z encoder heads 38 illustrated in FIG. 1 are just an example, and the actual number of X encoder heads 36 and Z encoder heads 38 can be greater than or fewer than five. Additionally, it should be noted that the use of multiple X encoder heads 36 and multiple Z encoder heads 38 enables the encoder assembly 32 to more accurately measure the position of the grating 34, and thus the position of the work piece 28 that is retained by the stage 20A, due to the stage 20A and the grating 34 moving relative to the encoder heads 36, 38. To effectively switch between encoder heads 36, 38, a footprint of the measurement beams 36A, 38A on the grating 34 needs to be small. For example, in one embodiment, the footprint of the measurement beams 36A, 38A on the grating 34 is the absolute minimum, i.e. the footprint of the measurement beams 36A, 38A on the grating 34 is simply the diameter of a single beam.

The design of the X encoder heads 36 can be varied. For example, in one non-exclusive embodiment, a suitable X encoder head 36 can be as described in U.S. Pat. No. 7,238,931 B2. As far as is permitted, the contents of U.S. Pat. No. 7,238,931 B2 are incorporated herein by reference. Alternatively, the X encoder heads 36 can have a different design. Additionally, in embodiments that further include one or more Y encoder heads, the Y encoder heads can have a design that is substantially similar to the X encoder heads 36, or the Y encoder heads can have a design that is different than the X encoder heads 36.

In certain embodiments, the Z encoder head 38 is uniquely designed so that the Z measurement beam 38A is at a wavelength that is approximately the same as a wavelength of the X measurement beam 36A, and the Z encoder head 38 can utilize the Z measurement beam 38A diffracted off of the grating 34 to determine the position of the grating 34 along the Z axis (i.e. the position normal to the work piece 28). With this design, the same grating 34 can be used to diffract both the Z measurement beam 38A and the X measurement beam 36A. This greatly simplifies the design, and allows the X and Z encoder heads 36, 38 to use the theoretically smallest overall beam footprint on the grating 34. Further, utilizing the diffracted light from the grating 34 vastly simplifies the grating structure and potentially removes many of the errors that come from the reflections from the multiple interfaces of prior versions of the grating 34.

Additionally, as provided herein, the grating 34 can be a one-dimensional grating (i.e. a grating with parallel lines running in one direction). Moreover, in certain embodiments, the grating 34 can have a pitch of approximately one micron (1 um). Further, in one embodiment, the depth and duty cycle of the grating lines are able to provide good diffraction efficiency in the +1 and −1 orders. Still further, in one embodiment, any retardation imparted by the grating 34 (i.e. for the polarization) is inhibited. Suitable gratings 34 can be found from commerially available sources, or from using a lithography tool capable of features on the order of one micron. Alternatively, the grating 34 can have a different design. For example, the grating 34 can be a two-dimensional grating with lines running perpendicular to one another in a checkerboard-like pattern. In such embodiment, the grating 34 can again be designed where the pitch in both directions is approximately one micron (1 um).

Further, in one embodiment, the encoder heads 36, 38 and the grating 34 can be designed to work with a light source having a wavelength of approximately 632.8 nm (e.g., a HeNe laser). Additionally and/or alternatively, the encoder heads 36, 38 and the grating 34 can be designed to work with beam sources having other wavelengths.

Further, in certain embodiments, the encoder assembly 32 has improved contrast, a relatively small Z encoder head 38 package size, a relatively small Z measurement beam 38A footprint, and high Z resolution and accuracy. As a result thereof, the wafer 28 can be positioned with improved accuracy, and the exposure apparatus 10 can be used to manufacture higher density wafers 28.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. Alternatively, the exposure apparatus 10 can be a step-and-repeat type photolithography system that exposes the reticle 26 while the reticle 26 and the wafer 28 are both stationary. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 is rigid and supports the components of the exposure apparatus 10. The apparatus frame 12 illustrated in FIG. 1 supports the reticle stage assembly 18, the optical assembly 16, the wafer stage assembly 20, and the illumination system 14 above the mounting base 30.

The illumination system 14 includes an illumination source 39A and an illumination optical assembly 39B. The illumination source 39A emits a beam (irradiation) of light energy. The illumination optical assembly 39B guides the beam of light energy from the illumination source 39A to the optical assembly 16. The beam of light energy selectively illuminates different portions of the reticle 26 and exposes the wafer 28.

The illumination source 39A can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 39A can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

The reticle stage assembly 18 holds and positions the reticle 26 relative to the optical assembly 16 and the wafer 28. In FIG. 1, the reticle stage assembly 18 includes a reticle stage 18A that retains the reticle 26, and a reticle stage mover assembly 18B that positions the reticle stage 18A and the reticle 26. The reticle stage mover assembly 18B can be designed to move the reticle 26 along the X, Y and Z axes, and about the X, Y and Z axes.

Somewhat similarly, the wafer stage assembly 20 holds and positions the wafer 28 with respect to the projected image of the illuminated portions of the reticle 26. In FIG. 1, the wafer stage assembly 20 includes the wafer stage 20A that retains the wafer 28, and a wafer stage mover assembly 20B that positions the wafer stage 20A and the wafer 28. The wafer stage mover assembly 20B can be designed to move the wafer 28 along the X, Y and Z axes, and about the X, Y and Z axes. In this embodiment, the wafer 28 can be scanned while the wafer stage assembly 20 moves the wafer 28 along the Y axis. In FIG. 1, the grating 34 is fixedly secured to the top of the wafer stage 20A.

The measurement system 22 measures and/or monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, autofocus systems, and/or other measuring devices in addition to the encoder assembly 32.

The control system 24 is connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

Figure 2A:
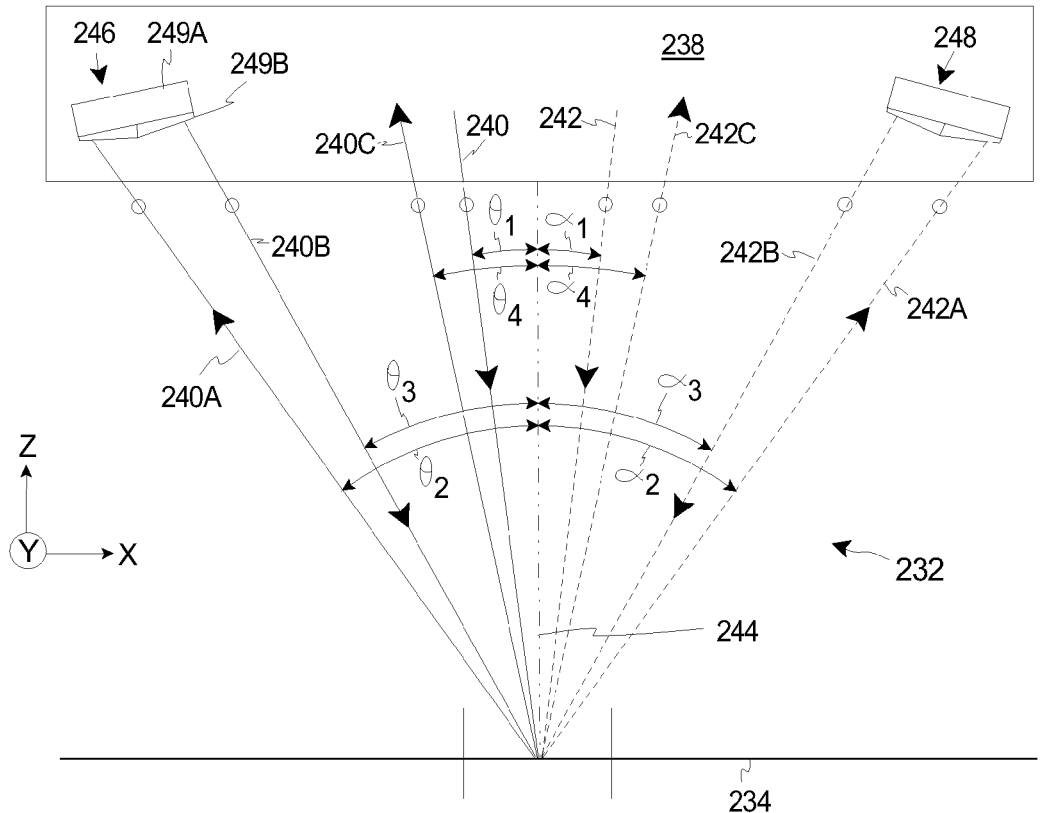
FIG. 2A is a simplified illustration of a portion of an encoder assembly having features of the present invention.

FIG. 2A is a simplified illustration of a portion of an encoder assembly 232 having features of the present invention. More particularly, FIG. 2A is a simplified illustration of a portion of a grating 234 and a Z encoder head 238 having features of the present invention. In one embodiment, as noted above, the grating 234 can be a one-dimensional grating (a grating with parallel lines running in one direction). For example, in the embodiment illustrated in FIG. 2A, the grating 234 can have parallel lines that run parallel to the Y axis. Alternatively, the grating 234 can be a two-dimensional grating having two sets of parallel lines that run substantially perpendicular to one another in a checkerboard-like manner. Additionally, in one non-exclusive embodiment, the grating 234 has a period of approximately one micron.

In the embodiments provided herein, the Z encoder head 238 directs a first measurement beam 240 (illustrated as a solid line with a circle) at the grating 234 at a FMB ("first measurement beam") angle $\theta_1$ relative to normal 244 of the grating 234 and a second measurement beam 242 (illustrated as a dashed line with a circle) at the grating 234 at a SMB ("second measurement beam") angle $\alpha_1$, relative to normal 244 of the grating 234. In this embodiment, an absolute value of the FMB angle $\theta_1$ relative to a normal 244 of the grating 234 is different from an absolute value of the SMB angle $\alpha_1$ relative to the normal 244 of the grating 234. As one non-exclusive example, the absolute value of the FMB angle $\theta_1$ relative to normal 244 can be approximately 2.5 degrees, and the absolute value of the SMB angle $\alpha_1$ relative to normal 244 can be approximately 3.0 degrees. Moreover, in certain non-exclusive, alternative embodiments, the absolute value of the FMB angle $\theta_1$ relative to normal 244 can differ from the absolute value of the SMB angle $\alpha_1$ relative to normal 244 by at least approximately 0.2, 0.3, 0.5, 0.7, 0.9, 1, 1.2 or more degrees.

It should be noted that the absolute value of the FMB angle $\theta_1$ relative to normal 244 differs from the SMB angle $\alpha_1$ relative to normal 244 to inhibit any stray light from negatively impacting the performance of the encoder assembly 232. During use, the grating 234 generates some 0-order diffracted light, and if $\alpha_1 = \theta_1$, then that 0-order light will be perfectly aligned to the other beam, which could lead to stray light that is perfectly aligned to the actual measurement beam.

Further, in this embodiment, the first measurement beam 240 is at a first wavelength $\lambda_1$, and the second measurement beam 242 is at a second wavelength $\lambda_2$ that is different from the first wavelength $\lambda_1$. The two wavelengths $\lambda_1$, $\lambda_2$ are generated from a common source such that they can be made to interfere with each other in a heterodyne matter, where the phase changes rapidly as a function of time. Heterodyne interferometery is familiar to those in the art.

Moreover, with the design provided herein, in certain embodiments, the polarization of the two measurement beams 240, 242 can be the same. This simplifies the design of the Z encoder head 238.

As provided herein, the first measurement beam 240 impinging on the grating 234 creates a diffracted beam that is directed back at the Z encoder head 238, and the second measurement beam 242 impinging on the grating 234 creates a diffracted beam that is directed back at the Z encoder head 238. These diffracted beams are then redirected back at the grating 234 and subsequently used to measure the position of the grating 234 along the Z axis. It should be noted that by utilizing diffracted light beams from the grating 234 instead of reflected light beams, the grating 234 structure can be greatly simplified and errors that may otherwise result from the reflections from multiple interfaces of the grating may be avoided.

For example, as illustrated in FIG. 2A, the first measurement beam 240 impinging on the grating 234 creates a +1 order, first measurement beam 240A that is directed back at the Z encoder head 238, and the second measurement beam 242 impinging on the grating 234 creates a −1 order, second measurement beam 242A that is directed back at the Z encoder head 238. Additionally, in this embodiment, the Z encoder head 238 includes (i) a first redirector 246 that redirects the +1 order, first measurement beam 240A as a second pass first measurement beam 240B back at the grating 234, with this beam 240B being diffracted from the grating 234 as the final first measurement beam 240C; and (ii) a second redirector 248 that redirects the −1 order, second measurement beam 242A as a second pass second measurement beam 242B back at the grating 234, with this beam 242B being diffracted from the grating 234 as the final second measurement beam 242C.

In certain embodiments, each redirector 246, 248 can be an "imperfect" retroreflector, such as an "imperfect" corner cube. In one such embodiment, each redirector 246, 248 can include a perfect corner cube 249A and a pair of wedged glass plates 249B oriented oppositely and mounted in front of the 'perfect' corner cube 249A. With this design, the wedged glass plates 249B refract the respective beam exiting the redirector 246, 248 relative to the respective input beam to make the input and output beams to the redirector 246, 248 no longer parallel to each other.

In order for the redirectors 246, 248, i.e. the imperfect retroreflectors, to work as designed, the input and output beams must be fully spatially separated along the X axis as shown in FIG. 2A. For example, in one non-exclusive embodiment, for an angle difference between the first output beam from the grating 234 (e.g., at 35.5 degrees) and the second pass input beam (e.g., at 30.2 degrees) of 5.3 degrees, and a beam diameter of 2.0 millimeters, there is a minimum optical distance to achieve clear separation of the input and output beams. Therefore, fold mirrors are used to maintain the minimum package size for the Z encoder head 238. Of course if the angle difference, e.g., 5.3 degrees, between the beams could be increased, the distance to spatially separate the beams would decrease. However, there is an important reason why this cannot be done in practice.

For example, in alternative embodiments wherein the retroreflector is perfect, any tip/tilt of the grating 234 is perfectly cancelled out by the second pass beam. When the retroreflector is imperfect, however, because the beams are diffracted by the grating 234 and not reflected, and the diffraction relationship is non-linear, as the angle difference introduced by the imperfect corner cube increases from 0°, a small angle difference between the two beams is introduced as the stage tilts. In other words, an imperfect retroreflector combined with the diffracted beams and stage tilt no longer results in complete insensitivity to stage tip or tilt. The maximum allowed angle difference depends on beam diameter, expected range of stage tilts (i.e. +/−1 mrad), wavelength, grating pitch and angle of incidence. The angle difference of this design, i.e. 5.3 degrees, represents a reasonable tradeoff between all of the critical parameters involved. For a stage tip or tilt of +/−1 mrad, there will not be any appreciable contrast loss in the interference signal due to the angle difference.

In one embodiment, the redirectors 246, 248 are designed so that the second pass first measurement beam 240B and the second pass second measurement beam 242B overlap and impinge at the same (or approximately the same) location on the grating 234. However, the angles of these beams 240B, 242B on the grating 234 are different. This keeps the zero order from being parallel to 1$^{st}$ order beams, and prevents the zero order from entering the measurement signal to cause errors. Further, with this design, the final measurement beams 240C, 242C can be separated for analysis and this inhibits second order beams from entering the measurement signal and causing errors. Further, with the present design, any zero order or second order light exiting from the grating 234 will not cause cyclic non-linear error ("CNLE"), which may otherwise be caused by coherent stray light that is collinear or nearly collinear to the final measurement beams, because all such beams will not be parallel to either of the final measurement beams 240C, 242C.

In one embodiment, the first measurement beam 240 (first pass of the FMB on the grating 234), the second measurement beam 242 (first pass of the SMB on the grating 234), the second pass first measurement beam 240B (redirected +1 order FMB), and the second pass second measurement beam 242B (redirected −1 order SMB) all overlap and impinge at exactly the same location on the grating 234. This minimizes the footprint of the beams 240, 242, 240A, 242A on the grating 234 to the diameter of the individual beam(s). Thus, for a beam with a diameter of 2.0 millimeters, the total footprint for all the beams from one encoder head is also 2.0 millimeters.

In the non-exclusive example illustrated in FIG. 2A, (with the present design of the grating 234, the FMB angle $\theta_1$, and the SMB angle $\alpha_1$) (i) the absolute value of the FMB angle $\theta_2$ of the +1 order, first measurement beam 240A relative to normal 244 is approximately 35.5 degrees; (ii) the absolute value of the FMB angle $\theta_3$ of the second pass first measurement beam 240B relative to normal 244 is approximately 30.2 degrees; (iii) the absolute value of the FMB angle $\theta_4$ of the final first measurement beam 240C diffracted from the grating 234 relative to normal 244 is approximately 7.5 degrees; (iv) the absolute value of the SMB angle $\alpha_2$ of the −1 order, second measurement beam 241A relative to normal 244 is approximately 36.1 degrees; (v) the absolute value of the SMB angle $\alpha_3$ of the second pass second measurement beam 242B relative to normal 244 is approximately 30.8 degrees; and (vi) the absolute value of the SMB angle $\alpha_4$ of the final second measurement beam 242C diffracted from the grating 234 relative to normal 244 is approximately 7.0 degrees. However, these values can be changed by changing the design of the Z encoder head 238.

Additionally, with the present design, the two measurement beams 240, 242 are incident on the grating 234 at the same location, but at different angles $\theta_1$, $\alpha_1$, such that the two measurement beams 240, 242 can be incident with the same polarization state, and stray beams will not be collinear with the other measurement beam, resulting in no CNLE.

Further, the grating 234 that is required to work at only one incident polarization state can typically have higher diffraction efficiency (DE) into the orders required, thereby improving the light efficiency of the overall Z encoder head 238. Moreover, the proposed Z encoder head 238 does not require polarization optics since the polarization states of the two measurement beams 240, 242 are identical to each other and there is no need to rotate the polarization state in between the two passes of the grating 234 for each measurement beam 240, 242.

As noted above, FIG. 2A shows a non-exclusive example of the SMB angle $\alpha_1$, and the FMB angle $\theta_1$ that can be used to achieve isolation from CNLE. Consider a system using a nominal heterodyne wavelength of 632.8 nm and a grating 234 pitch of 1 um. The SMB angle $\alpha_1$, and the FMB angle $\theta_1$ shown in FIG. 2A come from the well known grating equation (Equation 1), where T is the grating pitch, $\lambda$ is the wavelength, $\theta_i$ is the angle of incidence and $\theta_d$ is the angle of diffraction for order m:

$$T(\sin\theta_i + \sin\theta_d) = m\lambda \qquad \text{Equation 1}$$

For the SMB angle $\alpha_1$ of 3.0 degrees, and the FMB angle $\theta_1$ of 2.5 degrees, none of the angles for the two incident and diffracted beams are equal to each other. In fact, zero order (reflected) beams and all second and higher orders for all the incident beams are at different angles, thereby effectively achieving the desired isolation from CNLE.

In summary, the proposed Z encoder head 238 has two measurement beams 240, 242, each of which is incident on the grating 234 twice. In between the first pass and the second pass for a given beam 240, 242, the respective beam 240, 242 goes through its corresponding redirector 246, 248. This allows the grating 234 to tip and tilt without introducing any change in beam angle for the measurement beams 240, 242.

Figure 2B:
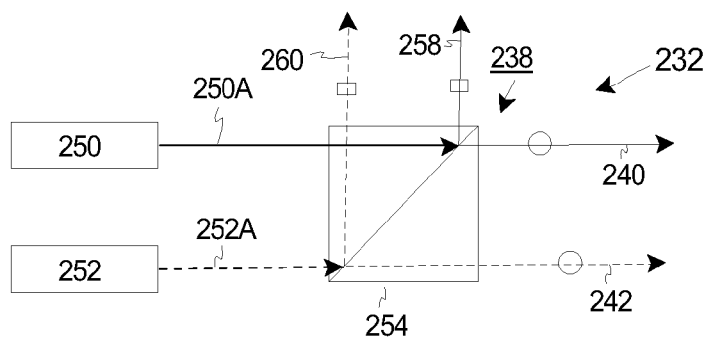
FIG. 2B is a simplified illustration of another portion of the encoder assembly illustrated in FIG. 2A.

FIG. 2B is a simplified illustration of another portion of the encoder assembly 232 illustrated in FIG. 2A. More specifically, FIG. 2B illustrates that the encoder assembly 232 can include (i) a first light source 250 that provides a first input beam 250A (a solid line) that is at the first wavelength $\lambda_1$, and (ii) a second light source 252 that provides a second input beam 252A (a dashed line) that is at the second wavelength $\lambda_2$ that is different from the first wavelength $\lambda_1$. In one embodiment, the input beams 250A, 252A have a nominal wavelength of 632.8 nm, are generated by the same light source, and the difference between the two input beams 250A, 252A in frequency is between about two and twenty MHz.

Additionally, FIG. 2B illustrates that the Z encoder head 238 can include a beam divider 254 (i) that divides the first input beam 250A into the first measurement beam 240 (illustrated as a solid line with a circle) and a first reference beam 258 (illustrated as a solid line with a square), and (ii) that divides the second input beam 252A into the second measurement beam 242 (illustrated as a dashed line with a circle) and a second reference beam 260 (illustrated as a dashed line with a square). With this design, (i) the first measurement beam 240 and the first reference beam 258 are at the first wavelength $\lambda_1$; and (ii) the second measurement beam 242 and the second reference beam 260 are at the second wavelength $\lambda_2$.

In this Z encoder head 238 design, the two reference beams 258, 260 corresponding to the two measurement beams 240, 242, respectively, do not ever hit the grating 234. Thus, in order to maintain high contrast between the reference beams 258, 260 and the measurement beams 240, 242, as the substrate stage tips or tilts, the double-pass arrangement of the redirectors 246, 248 (illustrated in FIG. 2A) is essential. However, if the redirectors 246, 248 used are 'perfect' retroreflectors, then the second pass, of the second pass first measurement beam 240B would be incident at an angle of 35.5 degrees, which is the same angle it left after the first pass, and not the 30.2 degrees as described above. If it were at the same angle, than the second output beam would overlap exactly with the first pass incident beam. Since no polarization optics are used, the beams would be collinear and at the same polarization state, so there would be no elegant way to separate them so a measurement could be made. Thus, to separate the final output from the measurement beams 240, 242, and to prevent CNLE due to stray light, in certain embodiments, the redirectors 246, 248, i.e. the retroreflectors, are purposefully 'imperfect'.

Figure 2C:
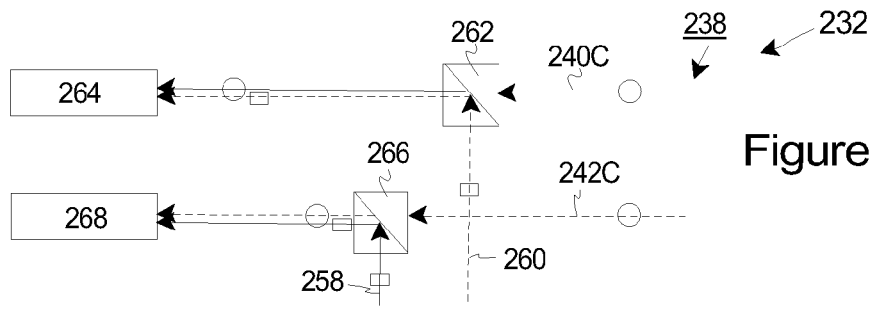
FIG. 2C is a simplified illustration of yet another portion of the encoder assembly illustrated in FIG. 2A.

FIG. 2C is a simplified illustration of yet another portion of the encoder assembly 232 illustrated in FIG. 2A. More specifically, FIG. 2C illustrates that the Z encoder head 238 can include (i) a first beam combiner 262 that interferes the final first measurement beam 240C (illustrated as a solid line with a circle) and the second reference beam 260 (illustrated as a dashed line with a square) to form a second measurement signal (M2), and directs these beams 240C, 260 to a first detector 264; and (ii) a second beam combiner 266 that interferes the final second measurement beam 242C (illustrated as a dashed line with a circle) and the first reference beam 258 (illustrated as a solid line with a square) to form a first measurement signal (M1), and directs these beams 242C, 258 to a second detector 268. Alternatively, in some embodiments, the detectors 264 and 268 can be replaced by fiber couplers so that the optical signal can be converted to an electrical signal at some distance away from the Z encoder head 238.

As provided herein, each pair of interfering beams are used by the control system to produce a measurement signal that is sensitive to X and Z motions. Stated in another fashion (i) the interfering final first measurement beam 240C and the second reference beam 260 are used by the first detector 264 to produce the second measurement signal (M2) that is sensitive to X and Z motions; and (ii) the interfering final second measurement beam 242C and the first reference beam 258 are used by the second detector 268 to produce the first measurement signal (M1) that is sensitive to X and Z motions. As provided herein, because M1 uses −1 diffracted light (and has a negative x-sensitivity) and M2 uses +1 diffracted light (and has a positive x-sensitivity), the X measurement sensitivity is equal in magnitude but opposite in sign for M1 and M2, and so the summation of the two measurement signals in the software results in a single measurement value that is only sensitive to Z motions of the grating 234 (illustrated in FIG. 2A), as the X sensitivity for the measurement signals M1, M2 is cancelled out. In one embodiment, the phase measurement method used by the detectors 264, 268 is heterodyne detection.

With this design, the control system generates the first measurement signal utilizes the first measurement beam and the second measurement signal utilizes the second measurement beam. As provided herein, because the wavelength of the first measurement beam is different from the wavelength of the second measurement beam, an error sensitivity of the first measurement signal is substantially equal to and opposite from an error sensitivity of the second measurement signal.

As can be seen by the explanation given so far, the Z encoder head 238 uses first order diffracted light from the grating 234 (illustrated in FIG. 2A) at a single polarization. This allows the grating 234 to be designed to only diffract well for a single polarization state, which can be designed to be the same polarization state as used by the X (or Y) encoder heads, so that the grating 234 must work well for only one linear polarization state.

Figure 3:
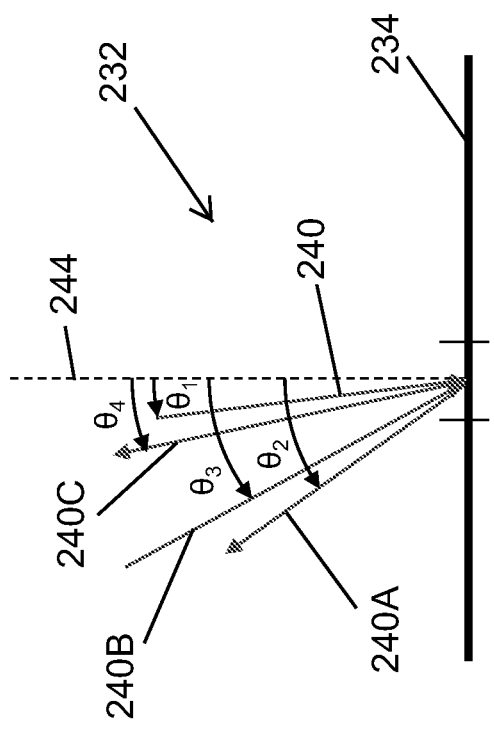
FIG. 3 is a simplified illustration of first measurement beams and a grating usable as part of the encoder assembly.

FIG. 3 is a simplified illustration of the first measurement beams 240, 240A, 240B, 240C and the grating 234 usable as part of the encoder assembly 232. In particular, FIG. 3 illustrates (i) the first measurement beam 240 that is directed at the grating 234 at the FMB angle $\theta_1$ relative to normal 244 of the grating 234; (ii) the +1 order, first measurement beam 240A that is directed back at the Z encoder head 238 (illustrated in FIG. 2A) at an angle $\theta_2$ relative to normal 244 of the grating 234; (iii) the second pass first measurement beam 240B that is redirected by the first redirector 246 (illustrated in FIG. 2A) back at the grating 234 at an angle $\theta_3$ relative to normal 244 of the grating 234; and (iv) the final first measurement beam 240C that is diffracted from the grating 234 at an angle $\theta_4$ relative to normal 244 of the grating 234. Additionally, the total footprint for the beams on the grating 234 can be approximately 2.0 millimeters, or the diameter of one of the measurement beams. Further, as noted above, in one non-exclusive embodiment, the grating 234 can have a period of approximately one micron, i.e. the grating 234 can be a one micron pitch grating.

Referring also to FIG. 2A, one important thing to note about using two different angles of incidence for the two measurement beams 240, 242 is that this results in different Z sensitivities for the two measurements, M1 and M2. This is because the sensitivity to Z is dependent on the angle of incidence relative to the surface normal, as shown in Equation 2 below.

$$Z_{Sensitivity} = \frac{z}{\cos(\theta_1)} + \frac{z}{\cos(\theta_2)} + \frac{z}{\cos(\theta_3)} + \frac{z}{\cos(\theta_4)} \quad \text{Equation 2}$$

However, both measurement beams 240, 242 have the same magnitude (but opposite sign) of X sensitivity. This is because the X sensitivity comes from the phase introduced by the grating 234. This depends on the order of diffraction (i.e +1 order has 1x sensitivity to X motion, −2 order has −2x sensitivity to X motion, etc), not the angle of incidence. Therefore, Equations 3 and 4 below give the sensitivities of the two measurement signals, M1 and M2:

$$M1 \text{ sensitivity}=\text{Meas}(\lambda_2)-\text{Ref}(\lambda_1)=Az-2x \quad \text{Equation 3}$$

$$M2 \text{ sensitivity}=\text{Meas}(\lambda_1)-\text{Ref}(\lambda_2)=Bz+2x \quad \text{Equation 4}$$

Note that the measurement beam for M1 uses $\lambda_2$ as the wavelength for the measurement beam, and it makes a −1 diffraction on both passes; therefore it is a (−1, −1) beam and has a negative X sensitivity. On the other hand, the measurement beam for M2 uses $\lambda_1$ as the wavelength for the measurement beam, and it makes a +1 diffraction on both passes; therefore it is a (+1, +1) beam and has a positive X sensitivity. The constants A and B represent the Z sensitivities for the two interferometers, and A≠B since the beams come in at 2 different angles. The two interferometer (measurement) signals are added together in software as shown in Equation 5:

$$\text{Stage\_height}=M1+M2=(A+B)z \quad \text{Equation 5}$$

For the angles shown in FIG. 2A, the nominal value of A is 4.41, and the nominal value of B is 4.39. So for every one nanometer of stage height change, the Z encoder head 238 will measure 8.8 nanometer of phase change. If $2\pi$ of phase is 632.8 nanometer of OPD, and the heterodyne detection system can resolve one digital count as 1 part in 2^13 (8192) of phase, the resolution of this Z encoder head 238 will be 0.009 nanometers (as shown below):

632.8 nm/8192=0.077 nm phase change/count $$0.077 \text{ nm phase change}*1 \text{ nm stage height}/8.8 \text{ nm phase change}=0.009 \text{ nm} \quad \text{Equation 6}$$

Thus, the resolution of the Z encoder head 238 will be about 9 picometers. Of course, noise and other errors will mean the repeatability will be somewhat worse than this. However, there are several other features about the current invention that make it substantially insensitive to many of the error sources known to plague encoders or interferometric systems.

Figure 4A:
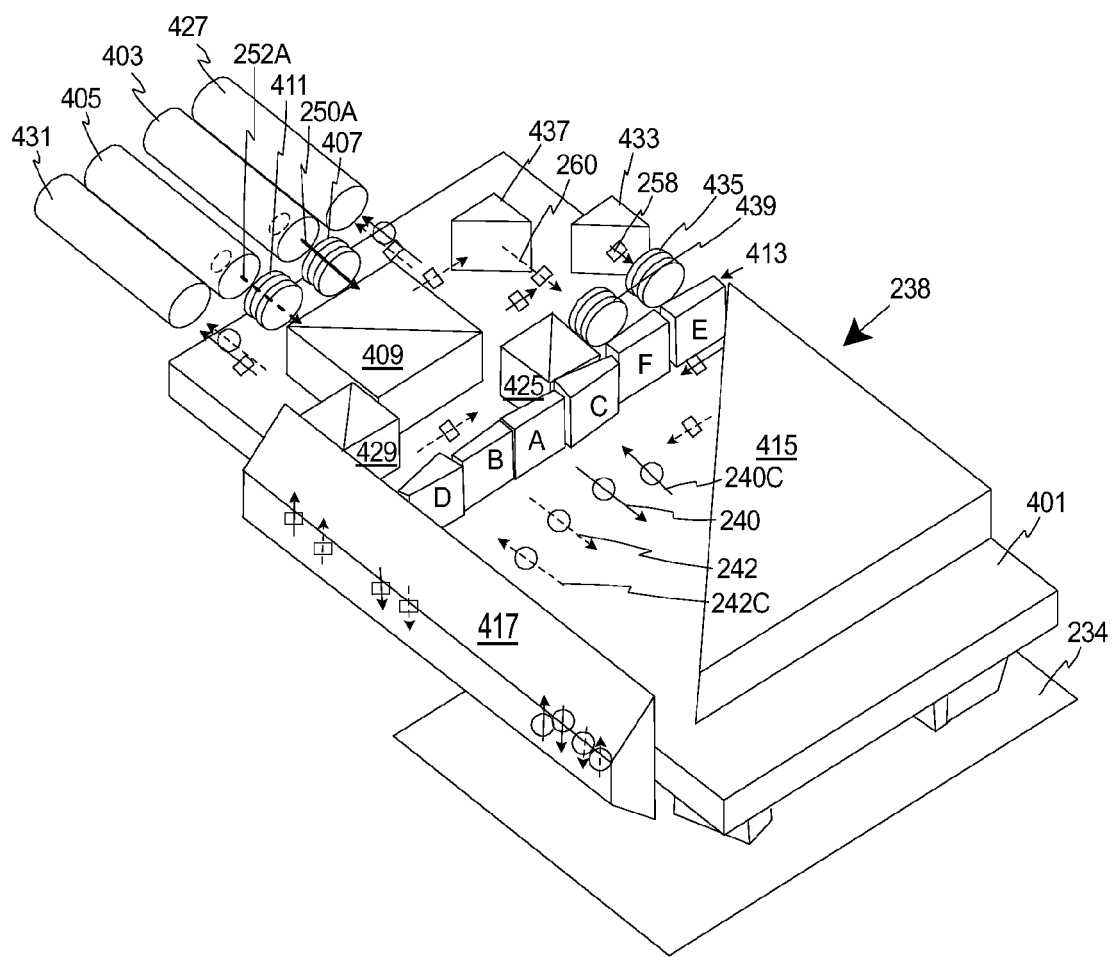
FIG. 4A is a top, perspective view of an encoder assembly having features of the present invention including a grating and an encoder head.
Figure 4B:
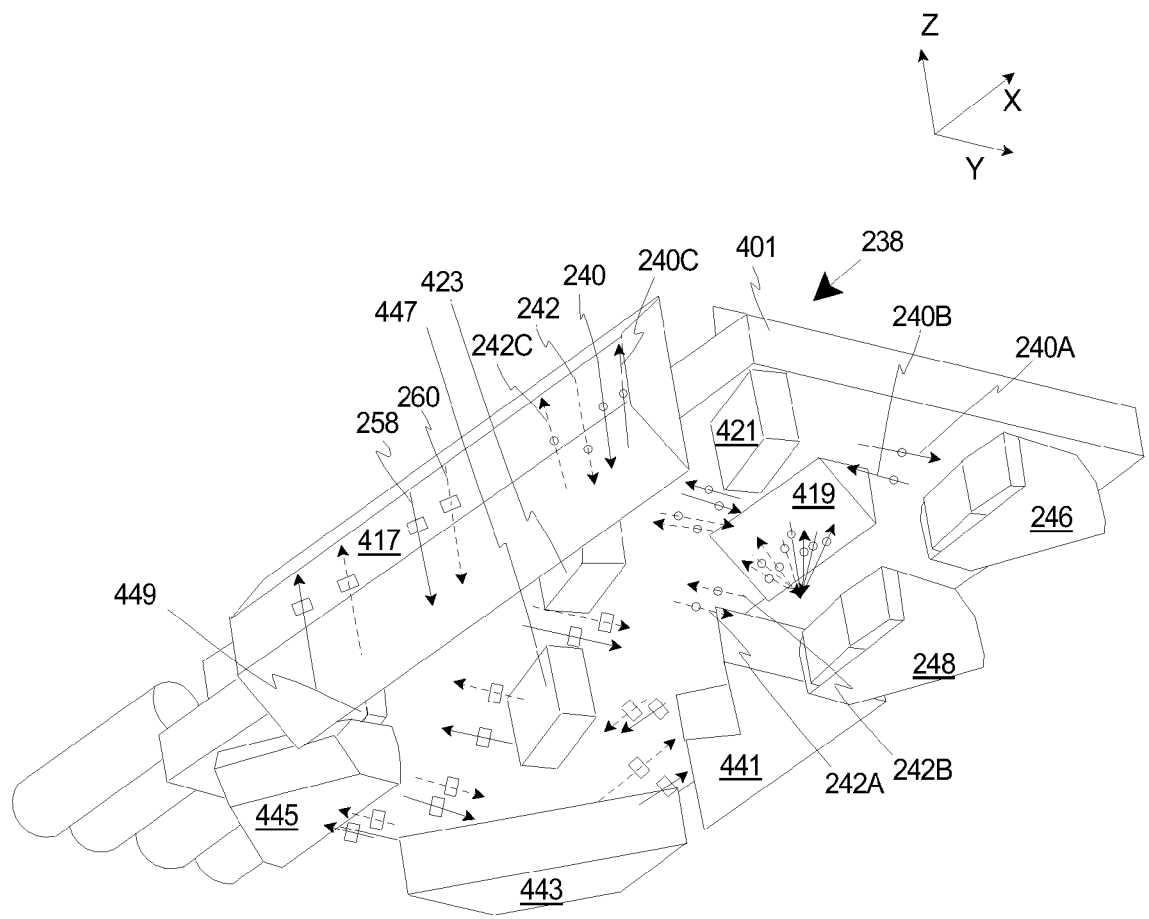
FIG. 4B is a bottom, perspective view of the encoder head illustrated in FIG. 4A.

FIG. 4A is a simplified top perspective view of a portion of the grating 234 and one embodiment of the Z encoder head 238 having features of the present invention. Additionally, FIG. 4B is a simplified bottom perspective view of the Z encoder head 238 illustrated in FIG. 4A.

The design of the Z encoder head 238 can be varied. FIGS. 4A and 4B illustrate one non-exclusive way in which the input beams 250A, 252A can be used to direct two measurement beams 240, 242 (illustrated in FIG. 2A) at the grating 234 to determine the Z position of the grating 234. Further, it should be noted that the encoder head 238 designs provided herein are merely schematic and are just meant to show the use of the present invention.

It should be noted that in FIGS. 2A-4B, (i) beams at the first wavelength $\lambda_1$ are represented with a solid line, (ii) beams at the second wavelength $\lambda_2$ are represented with a dashed line, (iii) measurement beams are designated with a circle, and (iv) reference beams are designated with a square. Thus, (i) the first measurement beam 240 is represented with a solid line and a circle, (ii) the second measurement beam 242 is represented with a dashed line and a circle, (iii) the first reference beam 258 is represented with a solid line and a square, and (iv) the second reference beam 260 is represented with a dashed line and a square. Further, the arrow head represents the direction of travel of the respective beam.

In FIG. 4A, the encoder head 238 directs two measurement beams 240, 242 (illustrated in FIG. 2A) at the grating 234 to monitor the position of the grating 234 along the Z axis.

As shown, the encoder head 238 includes an encoder body 401 that retains the other components of the encoder head 238. For example, in one embodiment, the encoder body 401 can be a glass plate that retains the other components of the encoder head 238.

FIG. 4A illustrates the paths of the beams that occur above the encoder body 401. In one embodiment, (i) the encoder head 238 receives the first input beam 250A from the first light source 250 (illustrated in FIG. 2B) via a first input fiber 403 that launches the first input beam 250A along the X axis; and (ii) the encoder head 238 receives the second input beam 252A from the second light source 252 (illustrated in FIG. 2B) via a second input fiber 405 that launches the second input beam 252A along the X axis. With this design, the two wavelengths are delivered on separate polarization maintaining fibers 403, 405 to prevent any unwanted mixing between the two wavelengths. In FIG. 4A, the first input beam 250A is launched parallel to the second input beam 252A, and the beams 250A, 252A are aligned in the XY plane and spaced apart along the X axis.

Further, in one embodiment, each input beam 250A, 252A has a circular cross-section. As a non-exclusive embodiment, each input beam 250A, 252A is collimated and has a diameter of approximately two millimeters.

In FIG. 4A, the first input beam 250A exiting the first input fiber 403 is directed along the X axis through a pair of Risley prisms 407 and subsequently at a beam splitter 409 where it is split into (i) the first measurement beam 240 continuing on the X axis, and (ii) the first reference beam 258 directed along the Y axis as shown in FIG. 2B. Similarly, the second input beam 252A exiting the second input fiber 405 is directed along the X axis through a pair of Risley prisms 411 and subsequently at the input beam splitter 409 where it is split into (i) the second measurement beam 242 continuing on the X axis, and (ii) the second reference beam 260 directed along the Y axis.

The first measurement beam 240 is directed at a beam adjuster (A) (e.g., a wedge prism) of a beam adjuster assembly 413 that adjusts the angle of the first measurement beam 240 so that the first measurement beam 240 impinges on the grating 234 at the desired angle (e.g., 2.5 degrees relative to the x-axis). Similarly, the second measurement beam 242 is directed at a beam adjuster (B) (e.g., a wedge prism) of the beam adjuster assembly 413 that adjusts the angle of the second measurement beam 242 so that the second measurement beam 242 impinges on the grating 234 at the desired angle (e.g., 3.0 degrees relative to the x-axis).

Next, the first measurement beam 240 and the second measurement beam 242 are directed at a large fold mirror 415 that directs the measurement beams 240, 242 approximately along the Y axis at a large roof prism 417. Next, the large roof prism 417 redirects the measurement beams 240, 242 from above the encoder body 401 to below the encoder body 401. Stated in a different fashion, the large roof prism 417 folds the beams 240, 242 and moves the beams 240, 242 from the top of the encoder body 401 to the bottom of the encoder body 401 via two reflections inside the large roof prism 417.

It should be noted that the encoder head 238 includes multiple pairs of Risley prisms that can be individually rotated to introduce independent tilts in the beams to allow the beams to be aligned and achieve maximum signal contrast while compensating for any assembly errors.

As provided above, FIG. 4B is a simplified bottom perspective view of the encoder head 238. FIG. 4B illustrates the movement of the beams that occur below the encoder body 401.

As illustrated in FIG. 4B, the measurement beams 240, 242 exiting the large roof prism 417 are directed at and incident on a measurement fold mirror 419 that directs the measurement beams 240, 242 downward at the grating 234 (not shown in FIG. 4B) such that the two measurement beams 240, 242 overlap on the grating 234.

The diffracted +1 order first measurement beam 240A is directed back at the measurement fold mirror 419 which directs this beam 240A at a reflector 421 that directs the beam 240A at the first redirector 246. Subsequently, the first redirector 246 redirects the second pass first measurement beam 240B back at the reflector 421, that directs the beam 240B at the measurement fold mirror 419. The fold mirror 419 directs the beam 240B downward at the grating 234. Next, the final first measurement beam 240C is diffracted from the grating 234 back at the fold mirror 419 which directs the beam 240C at the large roof prism 417.

Similarly, the diffracted −1 order second measurement beam 242A is directed back at the measurement fold mirror 419 which directs this beam 242A at a reflector 423 that directs the beam 242A at the second redirector 248. Subsequently, the second redirector 248 redirects the second pass second measurement beam 242B back at the reflector 423, that directs the beam 242B at the measurement fold mirror 419. The fold mirror 419 directs the beam 242B downward at the grating 234. Next, the final second measurement beam 242C is diffracted from the grating 234 back at the fold mirror 419 which directs the beam 242C at the large roof prism 417.

Next, the large roof prism 417 redirects the final measurement beams 240C, 242C from below the encoder body 401 to above the encoder body 401.

Returning to FIG. 4A, the final measurement beams 240C, 242C are directed by the large roof prism 417 at the large fold mirror 415, which directs the first final measurement beam 240C along the X axis through a beam adjuster (C) (e.g., a wedge prism) of the beam adjuster assembly 413, and directs the second final measurement beam 242C along the X axis through a beam adjuster (D) (e.g., a wedge prism) of the beam adjuster assembly 413. The beam adjusters C and D adjust the angles slightly to properly align the beams to the X axis.

Next, the first final measurement beam 240C is directed at a beam splitter 425 that combines the first final measurement beam 240C with the second reference beam 260 and directs these beams at a fiber facet of a first output fiber 427. The first output fiber 427 transmits these beams to the first detector 264 (illustrated in FIG. 2C). Somewhat similarly, the second final measurement beam 242C is directed at a beam splitter 429 that combines the second final measurement beam 242C with the first reference beam 262 and directs these beams at a fiber facet of a second output fiber 431. The second output fiber 431 transmits these beams to the second detector 268 (illustrated in FIG. 2C).

The paths of the reference beams 258, 260 can now be described. FIG. 4A illustrates that the reference beams 258, 260 can be created as the partial reflection from the input beam splitter 409. Next, the first reference beam 258 is folded by a reflector 433 along the X axis, through a pair of Risley prisms 435 and through a beam adjuster (E) (e.g., a wedge prism) of the beam adjuster assembly 413. Similarly, the second reference beam 260 is folded by a reflector 437 along the X axis, through a pair of Risley prisms 439 and through a beam adjuster (F) (e.g., a wedge prism) of the beam adjuster assembly 413. The wedge prisms E and F fold the two reference beams 258, 260 toward each other slightly.

Next, the reference beams 258, 260 impinge on the large fold mirror 415 which directs the reference beams 258, 260 approximately along the Y axis at the large roof prism 417. Next, the large roof prism 417 redirects the reference beams 258, 260 from above the encoder body 401 to below the encoder body 401.

Referring again to FIG. 4B, both reference beams 258, 260 exiting the large roof prism 417 are incident on a fold mirror 441, that directs the reference beams 258, 260 at another fold mirror 443, that directs the reference beams 258, 260 at a reference retroreflector 445. In one embodiment, the reference retroreflector 445 can be a perfect retroreflector. The reference retroreflector 445 redirects the reference beams 258, 260 back at fold mirror 443 that directs the reference beams 258, 260 at fold mirror 441. Subsequently, the first reference beam 258 is directed through a wedge prism 447 at the large roof prism 417; and the second reference beam 260 is directed through a wedge prism 449 at the large roof prism 417. In this embodiment, the wedge prisms 447, 449 make the reference beams 258, 260 parallel to each other.

The large roof prism 417 brings the two reference beams 258, 260 back to the top side of the encoder body 401. Referring back to FIG. 4A, at this time, (i) the first reference beam 258 exiting the large roof prism 417 is directed at the beam splitter 429 where it interferes with the final second measurement beam 242C; and (i) the second reference beam 260 exiting the large roof prism 417 is directed at the beam splitter 425 where it interferes with the final first measurement beam 240C.

Figure 4C:
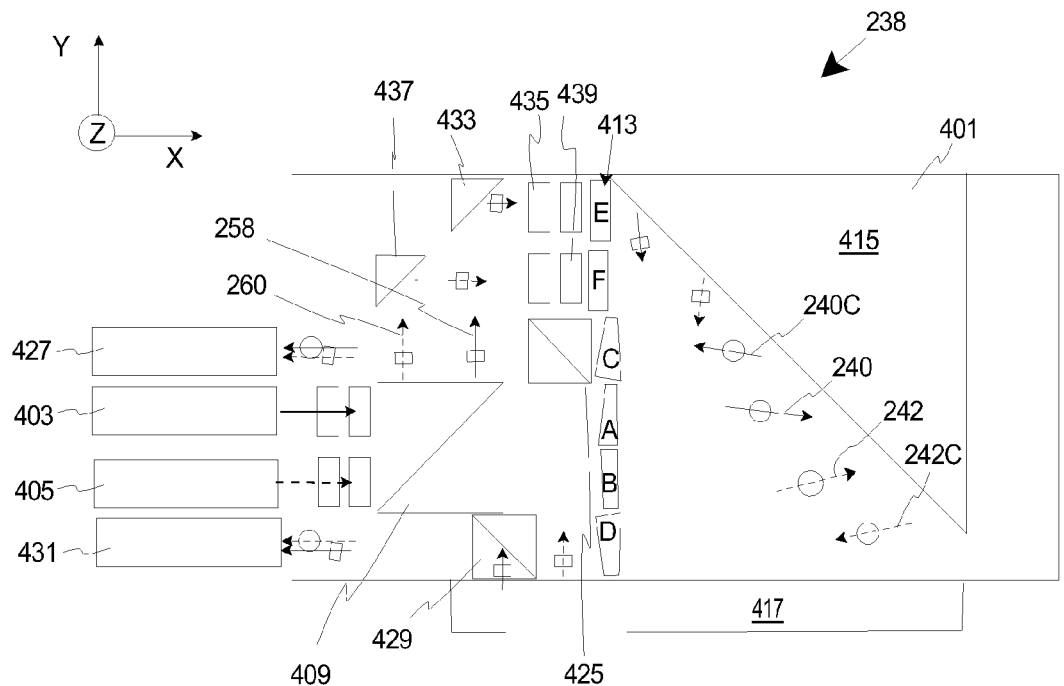
FIG. 4C is a top view of the encoder head illustrated in FIG. 4A.

FIG. 4C is a top view of the Z encoder head 238 illustrated in FIG. 4A. In particular, FIG. 4C illustrates the directing of the beams on the top side of the Z encoder head 238, i.e. above the encoder body 401, as discussed above in relation to FIG. 4A. Moreover, FIG. 4C further illustrates the design of one non-exclusive embodiment of the encoder body 401. In this embodiment, the encoder body 401 is a substantially rectangular-shaped glass plate having a length of approximately 60.0 millimeters and a width of approximately 32.0 millimeters. Alternatively, the encoder body 401 can have a different shape, and/or the dimensions of the encoder body 401 can be greater than or less than those dimensions specifically listed above.

Figure 4D:
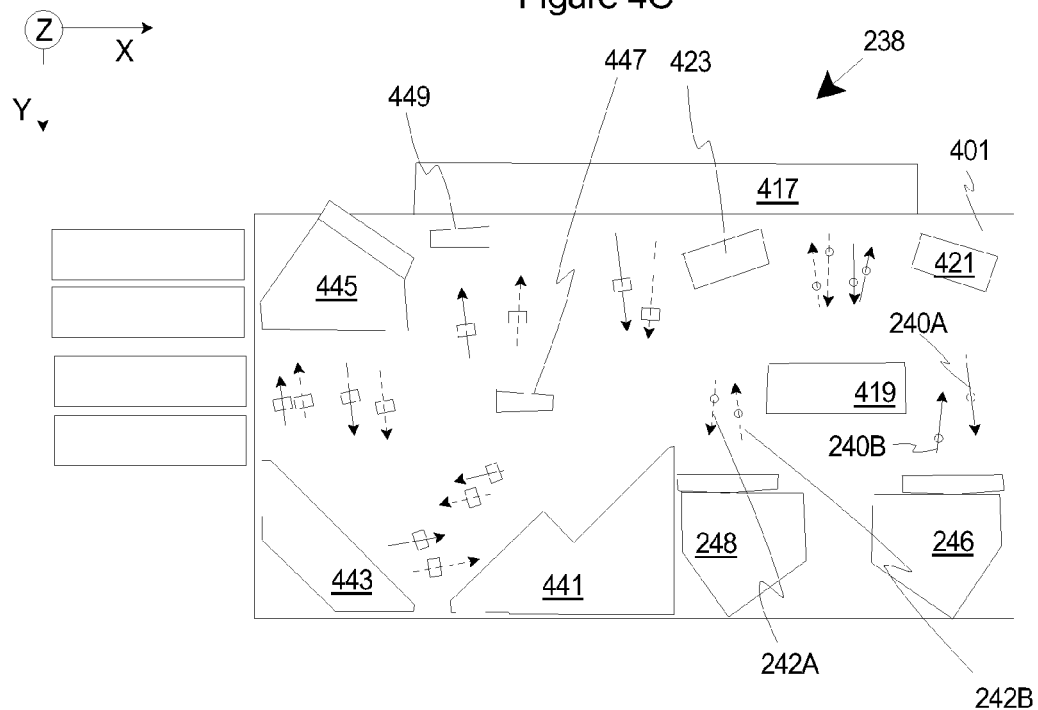
FIG. 4D is a bottom view of the encoder head illustrated in FIG. 4A.

FIG. 4D is a bottom view of the Z encoder head 238 illustrated in FIG. 4A. In particular, FIG. 4D illustrates the directing of the beams on the bottom side of the Z encoder head 238, i.e. below the encoder body 401, as discussed above in relation to FIG. 4B.

While it may not be obvious from FIGS. 4A-4D, the paths taken by the reference beams 258, 260 and the measurement beams 240, 242 are designed so that the total unequal glass path and unequal air path (aka 'dead path') seen by the 'Stage_height' signal (Equation 5) are zero. This makes the Z measurement more stable, since uniform temperature changes will cancel out in the 'Stage_height' signal. However, the air dead path for interferometer M1 (i.e. the second detector 268) is not zero, and the air dead path for interferometer M2 (i.e. the first detector 264) is also not zero. The main reason for this can be seen in FIG. 4A. The paths taken by the two reference beams 258, 260 are equal from the input beamsplitter 409 until the output of the large roof prism 417 as they return from the bottom of the encoder body 401. The second reference beam 260 for M2 must travel significantly farther to reach the M2 beam splitter 425 than the first reference beam 262 for M1 travels to reach the M1 beam splitter 429. Thus, exiting the large roof prism 417, the two reference beams 258, 260 must have unequal paths for this design. In addition, the two measurement beams 240, 242 have nominally the same path lengths until they reach the yz plane that corresponds to the input surface of the M2 beam splitter 425. Therefore, the signals measured by M1 and M2 both do not have zero dead path. As provided herein, Equations 3 and 4 above can be amended as shown here below:

$$M1 \text{ sensitivity}=\text{Meas}(\lambda_2)-\text{Ref}(\lambda_1)=Az-2x+\Delta_{AirDeadPathM1} \quad \text{Eq. 7}$$

$$M2 \text{ sensitivity}=\text{Meas}(\lambda_1)-\text{Ref}(\lambda_2)=Bz+2x+\Delta_{AirDeadPathM2} \quad \text{Eq. 8}$$

The Y position of the reference retroreflector 445 (FIG. 4B) can be adjusted in the design until $\Delta_{AirDeadPathM1}=-\Delta_{AirDeadPathM2}$. In this case, we see the effects of this non-zero dead path cancels out in the measurement of Z:

$$\text{Stage\_height}=M1+M2=(A+B)*z+\Delta_{AirDeadPathM1}-\Delta_{AirDeadPathM1} \quad \text{Eq. 9}$$

There is yet another known error that is completely cancelled out by this design of the Z encoder head 238. Since the two wavelengths are delivered on two separate fibers 403, 405 to prevent unwanted mixing, any small thermal change between the fibers 403, 405 will change the phase of one beam and not the other, leading to a change in the phase measured by both detectors 264, 268. However, as can be seen from Equations 7 and 8 and FIGS. 4A-4D, the two measurement beams 240, 242 used are the opposite wavelengths. So consider a small temperature change that increases the path length of the fiber carrying $\lambda_1$ by $\epsilon$. This will cause the M1 signal to decrease by $\epsilon$ (Equation 7). It will cause the signal seen by M2 to increase by an identical amount $\epsilon$, since the opposite wavelength is used as the measurement beam. Therefore, when the two signals M1 and M2 are combined as in Equation 9, the resulting error $\epsilon-\epsilon=0$, and there is no error introduced.

Typically in encoder head designs where the two wavelengths are delivered on separate fibers, the problem of path length drift is solved by having a dedicated reference signal generated on the encoder head, and the measurement of the error is used to correct the data. This works, but the solution proposed here is much more elegant. For a Z encoder head, it reduces the number of output interferometer signals from 3 to 2. Thus, 50% more heterodyne detectors would be required in a typical encoder head design that creates a dedicated reference signal. For a system employing many Z encoder heads, the savings from requiring fewer output fibers and heterodyne detectors can become significant.

In certain embodiments, the two wavelengths are delivered on polarization maintaining fibers, with vertical output polarization for both beams. This leads to the same input polarization for both measurement beams on both passes. Finally, since there are no retarders (waveplates) or polarizers in the system to change the polarization states, both measurement beams and both reference beams are still vertically polarized when they are combined at the M1 and M2 beamsplitters. Since they are the same polarization, they will interfere without the need for a polarizer. Since polarization optics can be expensive and are usually imperfect, this represents a significant simplification and cost savings for this Z encoder head 238 design.

In one embodiment, the Z encoder head 238 consists of a main glass plate that has glass components mounted to the top and bottom surfaces. All of the glass components can be made from the same glass type, so that any uniform temperature change will not induce any mechanical stress due to differential coefficients of thermal expansion.

Since the proposed Z encoder head 238 uses a collimated beam incident on the grating 234 as opposed to a focused beam on a mirror, a larger region on the grating 234 is used to generate the measurement signal. Therefore, any small defects on the surface of the grating 234 are a much smaller fraction of the beam size in the case of the current invention, and will cause a smaller error than the focused beam case by a ratio roughly proportional the area ratio of the two beams.

One possible issue with using a retroreflector as the redirector 246, 248 in between the first pass and the second pass off the grating 234 for the measurement beam(s) is that when the grating height (z) changes, the measurement beam shears, or shifts somewhat, on the grating. This is because the beams are not normally incident. The retroreflector essentially doubles the effect. If the measurement and reference beams are perfectly overlapping at z=0, then as z changes, the shear increases, and the overlap between the reference beams (which never hit the grating 234) and the measurement beams decreases, which reduces signal contrast. The effect depends on the total z range over which the encoder head 238 must work, the diameter of the beams and the angle of incidence for each beam. Consider a nominal case of a normally incident first pass beam and a perfect retroreflector between passes for a 1 um pitch grating and 632.8 nm wavelength, and a Δz of 1 mm. In this case, the shear for a double pass measurement beam would be about 1.64 mm. If a Littrow configuration was used, then the shear would be zero (this presents many other design challenges). Since the used configuration of FIG. 2A is between normal incidence and Littrow, it can be determined that the shear under the same conditions but with 3.0 degree initial angle of incidence and an imperfect retroreflector results in only 1.11 mm, or a reduction of more than 32%.

Figure 5:
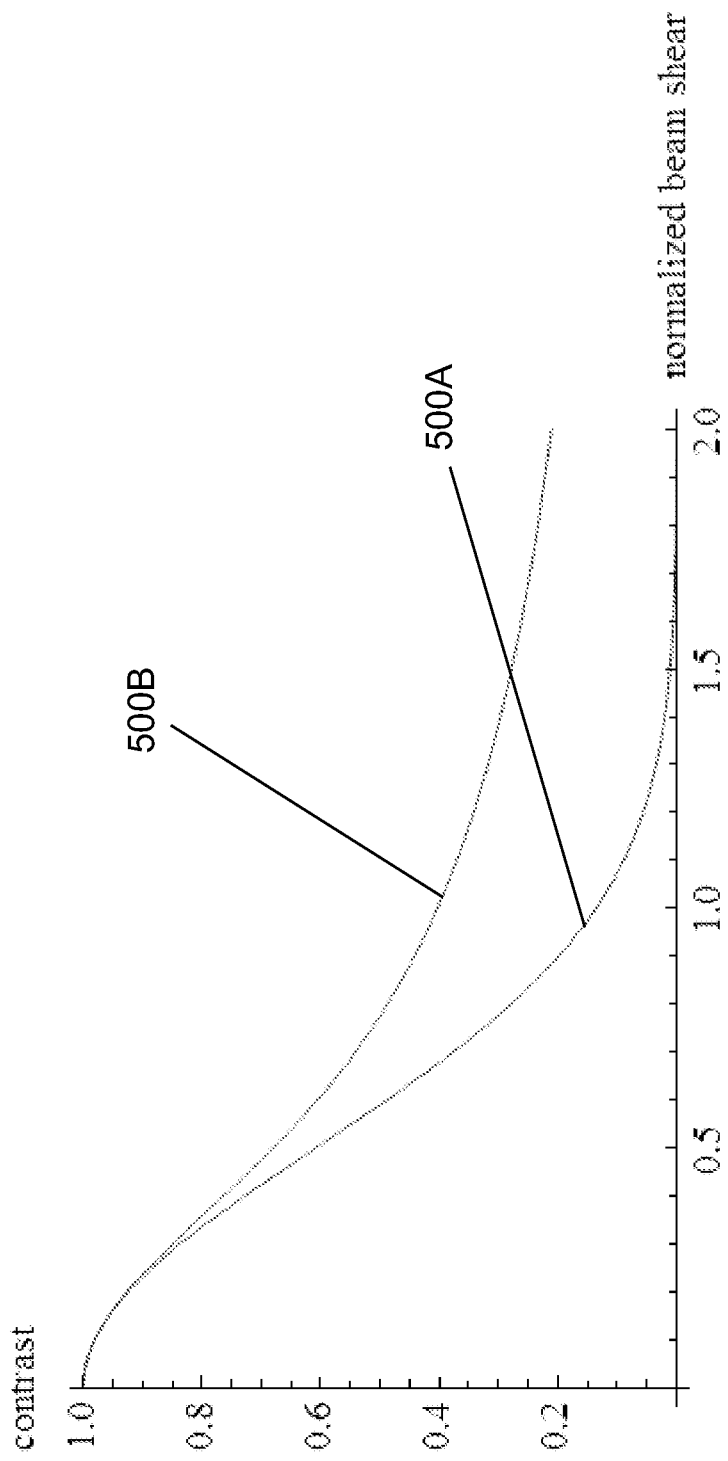
FIG. 5 is a graphical illustration showing the contrast loss as a function of normalized beam shear.

FIG. 5 is a graphical illustration showing the contrast loss as a function of normalized beam shear, where normalized beam shear is the ratio of the beam shear over the beam diameter, assuming a Gaussian beam irradiance profile. In particular, a first curve 500A, shows the contrast loss as a function of normalized beam shear when each of the beams, i.e. the reference beam and the measurement beam, are the same size. Additionally, a second curve 500B shows the contrast loss as a function of normalized beam shear when the reference beam is larger than the measurement beam by an optimal amount such that the contrast loss is less as the shear increases. This information can be used to determine the allowable z range for this encoder head, but in general it is on the order of +/−1 mm of z height change for this design.

Referring back to FIGS. 4A-4D, another important aspect of the present invention is the features used to make it easier to assemble. Since the beam angles are introduced using refraction (transmission through wedged glass prisms) rather than reflection, the alignment tolerances on these parts are relatively loose. Keeping in mind that it is more important for the two interfering beams to be parallel so that there is high contrast and that some amount of shear, or beam displacement, can be tolerated, it becomes clear that the angles of components, especially the reflective ones, could become very critical. However, care in the design has removed the mounting angle tolerance for many parts, including the large fold mirror 415, the roof prism 417, the fold mirrors 419, reference fold mirror 441 and reference fold mirror 443. This is because all of these reflective parts are used twice; once before and once after the beams go through a retroreflector. The retroreflection acts to cancel out any misalignment of the mount angles of these parts at the expense of some shear that increases as the misalignment angle increases. In addition, the mounting of the three retroreflectors is also not critical since they are retroreflectors and will introduce the desired folding of the beam regardless of their rotation about the retroreflector nodal point. In addition, the Risley prism pairs 407, 411, 435, 439 can be used to correct for any angle misalignment between the beams, further loosening the mounting tolerances for the various components.

In summary, advantages of the present invention can include, but are not limited to (i) measures Z axis of the grating while using diffracted (not reflected) light; (ii) allows for a $1^{st}$ surface grating to be used instead of a complex multilayer plate, (iii) allows the same wavelength to be used for x, y and z encoder measurement, (iv) all measurement beams overlap on the grating, minimizing the beam footprint, (v) large beam size is relatively insensitive to grating fabrication errors, (vi) beam shear is minimized, (vii) insensitive to tilting of the grating, (viii) Z measurement has matched glass and air paths for reduced thermal sensitivity, (ix) assembled into a single piece of glass, (x) high resolution (~9 picometers), (xi) minimum number of signals (no reference signal required to correct fiber error), (xii) no cyclic non linear error from stray light, (xiii) no polarization optics, (xiv) loose assembly tolerances due to design features, and/or (xv) high light efficiency.

In certain embodiments, the encoder head 36 is mounted to the optical assembly 16. Alternatively, the encoder head 36 can be mounted to the wafer stage assembly 20. In this situation, the measurement grating 34 can be mounted to the optical assembly 16 or another reference.

It should be noted that the use of the terms "first" and "second" to describe various features and elements of the present invention herein is merely for ease of discussion, and is not meant to limit the overall scope and breadth of the present invention. Accordingly, any such features and elements can be equally referred to as the "first" and/or "second" such features and elements.

While a number of exemplary aspects and embodiments of a measurement system 22 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A measurement system for measuring a relative movement along a first axis of a first object and a second object, the first object and the second object being movable relative to each other, the measurement system comprising:
    a grating that is coupled to one of the first object and the second object; and
    an encoder head that is coupled to the other of the first object and the second object, the encoder head including a first optical member and a second optical member, the encoder head directing a first measurement beam at the grating at a first angle, and directing a second measurement beam at the grating at a second angle; wherein an absolute value of the first angle relative to a normal of the grating is different than an absolute value of the second angle relative to the normal of the grating, and wherein the first measurement beam has a first wavelength, and the second measurement beam has a second wavelength that is different than the first wavelength;
    wherein the first optical member redirects a diffracted first measurement beam back at the grating; and
    wherein the second optical member redirects a diffracted second measurement beam back at the grating.

2. The measurement system of claim 1 wherein the first measurement beam impinging on the grating creates the diffracted first measurement beam as a +1 order beam directed back at the encoder head; and wherein the second measurement beam impinging on the grating creates the diffracted second measurement beam as a −1 order beam directed back at the encoder head.

3. The measurement system of claim 2 wherein (i) the first optical member is a first redirector that redirects the +1 order beam of the first measurement beam back at the grating, and (ii) the second optical member is a second redirector that redirects the −1 order beam of the second measurement beam back at the grating; and wherein the first measurement beam, the second measurement beam, +1 order beam of the first measurement beam, and the −1 order beam of the second measurement beam all impinge at approximately the same location on the grating.

4. The measurement system of claim 3 wherein each redirector is an imperfect corner cube.

5. The measurement system of claim 3 further comprising a first reference beam that is combined with the −1 order beam of the second measurement beam that is diffracted off of the grating, and a second reference beam that is combined with the +1 order beam of the first measurement beam that is diffracted off of the grating; and wherein the first reference beam is at the first wavelength and wherein the second reference beam is at the second wavelength.

6. A stage assembly that moves a work piece, the stage assembly including a stage that retains the work piece, and the measurement system of claim 1 measuring the position of the work piece.

7. An exposure apparatus including an illumination system and the stage assembly of claim 6 that moves the stage relative to the illumination system.

8. A process for manufacturing a device that includes the steps of providing a substrate and forming an image on the substrate with the exposure apparatus of claim 7.

9. A measurement system for measuring a relative movement along a first axis of a first object and a second object, the first object and the second object being movable relative to each other, the measurement system comprising:
 a grating that is coupled to one of the first object and the second object; and
 an encoder head that is coupled to the other of the first object and the second object, the encoder head including a first optical member and a second optical member, the encoder head directing a first measurement beam at the grating at a first angle, and directs directing a second measurement beam at the grating at a second angle; wherein an absolute value of the first angle relative to a normal of the grating is different than an absolute value of the second angle relative to the normal of the grating;
 wherein the first measurement beam has a first polarization, and wherein the second measurement beam has a second polarization that is the same as the first polarization;
 wherein the first optical member redirects a diffracted first measurement beam back at the grating; and
 wherein the second optical member redirects a diffracted second measurement beam back at the grating.

10. A measurement system for measuring a relative movement along a first axis of a first object and a second object, the first object and the second object being movable relative to each other, the measurement system comprising:
 a grating that is coupled to one of the first object and the second object; and
 an encoder head that is coupled to the other of the first object and the second object, the encoder head including a first optical member and a second optical member, the encoder head (i) directing a first measurement beam at the grating, the first measurement beam having a first polarization and a first wavelength; and (ii) directing a second measurement beam at the grating, the second measurement beam having a second polarization and a second wavelength, the second polarization being the same as the first polarization, and the second wavelength being different than the first wavelength; and wherein the first measurement beam and the second measurement beam impinge on the grating at approximately the same location;
 wherein the first optical member redirects a diffracted first measurement beam back at the grating; and
 wherein the second optical member redirects a diffracted second measurement beam back at the grating.

11. The measurement system of claim 10 wherein the encoder head directs the first measurement beam at the grating at a first angle, and directs the second measurement beam at the grating at a second angle; and wherein an absolute value of the first angle relative to a normal of the grating is different than an absolute value of the second angle relative to the normal of the grating.

12. The measurement system of claim 10 wherein the first measurement beam impinging on the grating creates the diffracted first measurement beam as a +1 order beam directed back at the encoder head; and wherein the second measurement beam impinging on the grating creates the diffracted second measurement beam as a −1 order beam directed back at the encoder head.

13. The measurement system of claim 12 wherein (i) the first optical member is a first redirector that redirects the +1 order beam of the first measurement beam back at the grating, and (ii) the second optical member is a second redirector that redirects the −1 order beam of the second measurement beam back at the grating; and wherein the first measurement beam, the second measurement beam, +1 order beam of the first measurement beam, and the −1 order beam of the second measurement beam all impinge at approximately the same location on the grating.

14. The measurement system of claim 12 further comprising a first reference beam that is combined with the −1 order beam of the second measurement beam that is diffracted off of the grating, and a second reference beam that is combined with the +1 order beam of the first measurement beam that is diffracted off of the grating; and wherein the first reference beam is at the first wavelength and wherein the second reference beam is at the second wavelength.

15. A stage assembly that moves a work piece, the stage assembly including a stage that retains the work piece, and the measurement system of claim 10 measuring the position of the work piece.

16. An exposure apparatus including an illumination system and the stage assembly of claim 15 that moves the stage relative to the illumination system.

17. A process for manufacturing a device that includes the steps of providing a substrate and forming an image on the substrate with the exposure apparatus of claim 16.

18. A method for measuring a relative movement along a first axis of a first object and a second object, the first object and the second object being movable relative to each other, the method comprising:
 directing a first measurement beam at a grating at a first angle with an encoder head, the grating being coupled to one of the first object and the second object and the encoder head being coupled to the other of the first object and the second object, wherein the first measurement beam has a first wavelength;
 directing a second measurement beam at the grating at a second angle with the encoder head, wherein an absolute value of the first angle relative to a normal of the grating is different than an absolute value of the second angle relative to the normal of the grating, and wherein the second measurement beam has a second wavelength that is different than the first wavelength;
 diffracting the first measurement beam and the second measurement beam with the grating;
 redirecting a diffracted first measurement beam back at the grating; and redirecting a diffracted second measurement beam back at the grating.

19. The method of claim 18 further comprising directing the diffracted first measurement beam as a +1 order beam back at the encoder head, the +1 order beam being created when the first measurement beam impinges on the grating; and directing the diffracted second measurement beam as a −1 order beam back at the encoder head, the −1 order beam being created when the second measurement beam impinges on the grating.

20. The method of claim 19 wherein redirecting the diffracted first measurement beam includes redirecting the +1 order beam of the first measurement beam back at the grating with a first redirector, and wherein redirecting the diffracted second measurement beam includes redirecting the −1 order beam of the second measurement beam back at the grating with a second redirector; and wherein the first measurement beam, the second measurement beam, +1 order beam of the first measurement beam, and the −1 order beam of the second measurement beam all impinge at approximately the same location on the grating.

21. The method of claim 20 further comprising the steps of combining a first reference beam with the −1 order beam of the second measurement beam that is diffracted off of the grating with a first beam combiner to form a first measurement signal; directing the first reference beam and the −1 order beam of the second measurement beam at a first detector with the first beam combiner; combining a second reference beam with the +1 order beam of the first measurement beam that is diffracted off of the grating with a second beam combiner to form a second measurement signal; and directing the second reference beam and the +1 order beam of the first measurement beam at a second detector with the second beam combiner; and wherein the first reference beam is at the first wavelength and wherein the second reference beam is at the second wavelength.

22. A method for measuring a relative movement along a first axis of a first object and a second object, the first object and the second object being movable relative to each other, the method comprising:
   directing a first measurement beam at a grating at a first angle with an encoder head, the grating being coupled to one of the first object and the second object and the encoder head being coupled to the other of the first object and the second object;
   directing a second measurement beam at the grating at a second angle with the encoder head, wherein an absolute value of the first angle relative to a normal of the grating is different than an absolute value of the second angle relative to the normal of the grating;
   diffracting the first measurement beam and the second measurement beam with the grating;
   redirecting a diffracted first measurement beam back at the grating; and
   redirecting a diffracted second measurement beam back at the grating,
   wherein the first measurement beam has a first polarization, and wherein the second measurement beam has a second polarization that is the same as the first polarization.

23. A measurement system for measuring a relative movement along a first axis of a first object and a second object, the first object and the second object being movable relative to each other, the measurement system comprising:
   a grating that is coupled to one of the first object and the second object; and
   an encoder head that directs a measurement beam at the grating such that the measurement beam impinges on the grating at a measuring point, receives a diffracted measurement beam from the measuring point at a first angle, and redirects the received diffracted measurement beam back at the grating such that the received diffracted measurement beam impinges on the grating at the measuring point at a second angle; wherein an absolute value of the first angle relative to a normal of the grating is different than an absolute value of the second angle relative to the normal of the grating.

24. The measurement system of claim 23 wherein the encoder head directs the measurement beam at the grating at the measuring point at a first angle, and redirects the received diffracted measurement beam back at the measuring point at a second angle that is different than the first angle.

25. The measurement system of claim 24 wherein an absolute value of the first angle relative to a normal of the grating is different than an absolute value of the second angle relative to the normal of the grating.

26. The measurement system of claim 23 wherein the encoder head includes a beam divider that divides an incident beam from a light source into the measurement beam and a reference beam.

27. The measurement system of claim 26 wherein the encoder head redirecting the received diffracted measurement beam back at the measuring point creates a re-diffracted measurement beam, and wherein the encoder head further includes a beam combiner that combines the reference beam and the re-diffracted measurement beam from the measuring point.

28. The measurement system of claim 23 wherein the encoder head includes a redirector that receives the diffracted measurement beam from the measuring point at the first angle, and redirects the received diffracted measurement beam back at the grating such that the received diffracted measurement beam impinges on the grating at the measuring point at the second angle.

29. The measurement system of claim 28 wherein the redirector is an imperfect corner cube.

* * * * *